United States Patent [19]
Burgin et al.

[11] Patent Number: 5,920,076
[45] Date of Patent: Jul. 6, 1999

[54] ION BEAM APPARATUS

[75] Inventors: David Richard Burgin, Wisborough Green; David Loome, East Grinsread; Simon Povall, Ashington, all of United Kingdom

[73] Assignee: Applied Materials, Inc., Santa Clara, Calif.

[21] Appl. No.: 08/809,547

[22] PCT Filed: Jul. 19, 1996

[86] PCT No.: PCT/GB96/01715

§ 371 Date: Jun. 20, 1997

§ 102(e) Date: Jun. 20, 1997

[87] PCT Pub. No.: WO97/04474

PCT Pub. Date: Feb. 6, 1997

[30] Foreign Application Priority Data

Jul. 21, 1995 [GB] United Kingdom .................. 9515090

[51] Int. Cl.⁶ .............................. H01J 37/15; H01J 37/08; H01J 27/02
[52] U.S. Cl. .................. 250/492.21; 250/423 R; 315/111.81
[58] Field of Search .................. 250/492.21, 423 R; 315/111.81

[56] References Cited

U.S. PATENT DOCUMENTS

| | | | |
|---|---|---|---|
| 4,187,124 | 2/1980 | Muller et al. | 250/492.21 |
| 4,274,004 | 6/1981 | Kanai . | |
| 4,580,058 | 4/1986 | Mears et al. | 250/492.21 |
| 4,806,769 | 2/1989 | Mori et al. . | |
| 4,843,563 | 6/1989 | Takahashi et al. | 364/490 |
| 4,849,901 | 7/1989 | Shimizu | 364/468 |
| 4,873,467 | 10/1989 | Kaufman et al. | 313/360.1 |
| 5,036,252 | 7/1991 | Löb | 315/111.31 |
| 5,096,536 | 3/1992 | Cathey, Jr. . | |
| 5,164,596 | 11/1992 | Noguchi et al. | 250/309 |
| 5,198,677 | 3/1993 | Leung et al. | 250/424 |
| 5,229,607 | 7/1993 | Matsui et al. | 250/306 |
| 5,317,161 | 5/1994 | Chalupka et al. | 250/423 R |
| 5,420,415 | 5/1995 | Trueira | 250/492.21 |

FOREIGN PATENT DOCUMENTS

| | | |
|---|---|---|
| 0003842 | 9/1979 | European Pat. Off. . |
| 0135366 | 3/1985 | European Pat. Off. . |
| 0 145 120 A1 | 6/1985 | European Pat. Off. . |
| 0217616 | 4/1987 | European Pat. Off. . |
| 0 326 824 A2 | 8/1989 | European Pat. Off. . |
| 0 488 307 A2 | 6/1992 | European Pat. Off. . |
| 59-165359 | 9/1984 | Japan . |
| 4043542 | 5/1992 | Japan . |
| 4051448 | 6/1992 | Japan . |
| 1502935 | 3/1978 | United Kingdom . |

OTHER PUBLICATIONS

Nakao et al., "3–dimensional Handling in Nano Manufacturing World", pp. 273–275, 1993.

Pedersen et al., "Three–Stage Acceleration System for High Energy Implanter", Nuclear Instruments and Methods in Physics Research B6, pp. 258–263, 1985.

*Primary Examiner*—Jack I. Berman
*Attorney, Agent, or Firm*—Boult Wade & Tennant

[57] ABSTRACT

An ion beam apparatus comprises a source of ions (1), an evacuatable chamber (11), first and second electrodes (3, 5) disposed within the chamber for forming an ion beam from ions from the ion source, the first electrode being electrically insulated from the second electrode. At least one insulating member (31, 33), at least part of which is within the chamber provides the insulation, wherein a part of the insulating member is positioned adjacent the wall of the chamber. Alternatively, means for feeding coolant proximate the insulating member is provided to withdraw heat from the insulating member.

16 Claims, 10 Drawing Sheets

ION BEAM APPARATUS

FIELD OF THE INVENTION

This invention relates to an ion beam apparatus for generating a beam of ions and in particular, but not limited to, an ion beam apparatus for use in an ion implanter.

DESCRIPTION OF THE PRIOR ART

A known apparatus used to generate a beam of ions for ion implantation is shown in FIG. 1. The beam generator is intended for use in an ion implanter, for example, as disclosed by Aitken in U.S. Pat. No. 4,847,504. The beam generator comprises an ion source 1 and a pair of electrodes 3 and 5 spaced from the ion source 1 and from each other along the beam line 8. The ion source 1 comprises a chamber 7 in which a plasma is generated. An aperture 9 is formed in the front face of the chamber 7 to allow ions to be extracted, and two sets of opposed apertures 4 and 6 are formed in the electrodes 3 and 5, each for defining the extraction optics for a particular range of extraction conditions. The electrodes 3 and 5 are spaced apart and electrically insulated from each other by a number of electrically insulating spacers 10. The ion source and electrodes are disposed within a vacuum chamber, and the electrode assembly is mounted on the arm 13 of an actuator, which extends through the wall 15 of the vacuum chamber and adjoins the electrode 5 which is furthest from the ion source 1. The arm 13 is coupled to the vacuum chamber wall 15 via bellows 17 so that the arm is free to move in three dimensions.

To generate an ion beam, the ion source is voltage biased relative to the electrodes, and ions are extracted from the ion source, accelerate towards the electrodes and pass through one of the sets of apertures 4 and 6. In the arrangement shown, the forward electrode 5 furthest from the ion source is maintained at ground potential, and the ion source 1 and the other back electrode 3 are voltage biased positively and negatively, respectively, relative to ground. The back electrode 3 closest to the ion source is generally known as the suppression electrode and serves to prevent electrons in the space forward of the electrode assembly, which are required to neutralise the ion beam, from being swept backwards to the ion source. The ion beam is tuned to the required energy and beam current by adjusting the voltage of the suppression electrode 2 and the ion source 1 and/or adjusting the size of the gap between the ion source and the electrodes, by means of the actuator. The position of the electrodes relative to the ion source is also adjusted to optically match the electrodes to the ion source.

One problem with this known arrangement is that the electrically insulating spacers 10 between the suppression and ground electrodes 3 and 5 breaks down in time as the surfaces of the insulating spacers 10 become electrically conductive due to the condensation of conductive particles, such as tungsten fluoride, on the surfaces from the ion source. In order to mitigate this problem, cylindrical shields 12, 14 are placed around each insulating spacer 10 to screen the insulating members from the gas flow and the surface material of the insulating spacers 10 has been carefully selected to reduce the rate of condensation as much as possible.

However, it has been found that when the gap between the electrode assembly and ion source is relatively small, the life of the insulator is dramatically decreased, in spite of the above measures, and in some cases has been found to drop from about 100 hours to only 7 hours.

Thus, it is an object of the present invention to provide an ion beam apparatus in which the duration of electrical insulation between the ion beam extraction electrodes by a given insulating member can be substantially extended as compared to the prior art.

SUMMARY OF THE INVENTION

According to one aspect of the present invention there is provided an ion beam apparatus comprising a source of ions, an evacuatable chamber, first and second electrodes disposed within said chamber for forming an ion beam from ions from said source, the first electrode being electrically insulated from the second electrode and including at least one insulating member, at least part of which is within said chamber, to provide said insulation, wherein a part of said insulating member is adjacent the wall of said chamber.

The inventors have found that by arranging a part of the insulating member, which electrically insulates the extraction electrodes from each other, adjacent or in contact with the wall of the vacuum chamber, the lifetime of the insulator is substantially increased. It is believed that this marked improvement is due to the insulator being cooled as heat is extracted from the vacuum chamber wall by the surrounding air.

In a preferred embodiment, part of the insulating member forms a surface portion of the chamber wall internal of the chamber. Advantageously, this arrangement extends the cross-sectional area of the insulating member from which heat can flow to the heat sink.

Preferably, a part of the insulating member forms a surface portion of the chamber wall external of the vacuum chamber. Advantageously, in this arrangement, a part of the insulating member is in direct contact with the air outside the vacuum chamber and therefore benefits directly from the cooling therefrom.

In one embodiment, at least one of the electrodes is mechanically coupled to a part of the wall of the vacuum chamber, wherein the part is arranged to separate, at least partially, the electrode from the insulating member. Preferably, this part is adapted to thermally insulate the electrically insulating member from the electrode by, for example, the surface of the part external of the vacuum chamber being formed with surface structure to promote heat loss from the surface. The structure is such as to render the surface generally unsmooth and may include, for example, protrusions and/or corrugations or the like. Preferably, the cross-sectional area of this part through which heat is conducted from the electrode to the insulating member is such as to oppose thermal conduction therethrough. In other words, the cross-sectional area of the insulating member is essentially reduced to present a thermal impedance to heat flowing therethrough. Furthermore, the part may further comprise a thermally insulating material. Advantageously, by providing thermal insulation between the electrode and the electrically insulating member, the conduction of heat between the electrode and the insulating member is minimised.

In one embodiment, the part of the wall between the insulating member and the electrode is adapted to permit the electrode to move in at least one direction relative to the chamber. Conveniently, the part may be formed with corrugations to permit the movement of the electrode and may comprise bellows. As the other side of the wall from that to which the electrode is coupled is accessible from outside the vacuum chamber, the position of the electrode relative to the ion source can be controlled from outside the chamber.

In a preferred embodiment, the surface of the insulating member within the chamber includes surface formations to extend the path length over the surface of the insulating member between the first and second electrodes. This measure further increases the life of the insulating member by effectively increasing the tracking length over the surface of the insulator. Preferably, the surface of the insulator is formed so that at least portions of the surface face away from the ion beam to provide shadowed regions upon which deposition occurs much more slowly. Again, this measure also helps to extend the lifetime of the insulating member.

A preferred embodiment includes a removable cover comprising an electrically insulating material and arranged to cover at least part of the surface of the insulating member within the chamber. Advantageously, the removable cover serves as a removable surface portion of the electrically insulating member which may be replaced more easily than replacing the main body of the insulating member, and in less time and at a lower cost. Preferably, the removable cover includes surface formations to extend the path length over the surface of the cover between the first and second electrodes, again to extend the useful life of the cover.

In a preferred embodiment, the apparatus further comprises first and second supports extending from the first and second electrodes, respectively, and each arranged to support a respective electrode from a position substantially at or external of the wall of the vacuum chamber. By supporting each electrode independently from the chamber wall or from a position external of the chamber wall, the need for any intervening member between the electrodes and the vicinity of the ion source is eliminated. This arrangement differs significantly from the prior art arrangement in which the suppression electrode is supported by the ground electrode which in turn is mounted on the arm of the actuator.

Preferably, the wall of the chamber is adapted to allow both the first and second supports to move in at least one direction relative to the chamber, thereby allowing the position of the electrodes relative to the chamber to be changed, and most preferably, the wall of the chamber is adapted to allow the supports to move independently of one another so that the position of electrodes can be changed relative to each other. This arrangement enables parameters relating the ion beam to be controlled with greater flexibility and the arrangement preferably allows the electrodes to be moved relative to one another in any direction so that, for example, the gap between the electrodes can be changed and each electrode can be aligned with the ion source independently of the other. Since each support is coupled separately to part of the chamber wall, the apparatus can readily be adapted so that the position of each electrode can be controlled from outside the vacuum chamber.

In a preferred arrangement of the above embodiment, the first and second supports are adapted to form an electrically conductive path to a respective said electrode from outside said chamber. This eliminates the need for separate high voltage leads, and associated insulators and seals at the vacuum chamber wall, to connect the various voltage supplies to the electrodes.

In addition to arranging the insulating member to lose heat to the air surrounding the vacuum chamber, the insulating member may also be actively cooled by providing means for feeding coolant proximate the insulating member for drawing heat therefrom.

Thus, according to another aspect of the present invention, there is provided an ion beam apparatus comprising a source of ions, an evacuatable chamber, first and second electrodes disposed within said chamber for forming an ion beam from ions from said source, the first electrode being electrically insulated from said second electrode, and including at least one insulating member, at least part of which is within said chamber, to provide said insulation, and means for feeding coolant proximate said insulating member for drawing heat therefrom.

One embodiment of this further aspect of the present invention includes a support for supporting one of said first and second electrodes, said insulating member being arranged to support the other electrode from one of said support and said one electrode, wherein said means for feeding is arranged to cool at least one said electrode and/or said support, such that heat from said insulating member flows into said coolant through said at least one said electrode and/or support. The advantage of this arrangement is that it is the electrode(s) or the support which is modified for cooling by the coolant, rather than the insulating member which needs to replaced from time to time. The contact area between the electrode or support and the insulating member could be substantially increased so that heat from the insulating member is transferred to the heat sink more efficiently.

According to another aspect of the present invention, there is provided an ion beam apparatus comprising an ion beam generator, an evacuatable chamber, first and second electrodes disposed within said chamber, each being spaced from said ion beam generator and arranged to control said ion beam, the first electrode being electrically insulated from the second electrode and including at least one insulating member, at least part of which is within said chamber, to provide said insulation, wherein a part of said insulating member is adjacent the wall of said chamber.

According to another aspect of the present invention, there is provided an ion beam apparatus comprising an ion beam generator, an evacuatable chamber, first and second electrodes disposed within said chamber, each being spaced from said ion beam generator and arranged to control said ion beam, the first electrode being electrically insulated from said second electrode, and including at least one insulating member, at least part of which is within said chamber, to provide said insulation, and means for feeding coolant proximate said insulating member for drawing heat therefrom.

According to another aspect of the present invention, there is provided an ion beam apparatus comprising a source of ions, an evacuatable chamber, first and second electrodes disposed within the chamber for forming an ion beam from ions from said source, the first electrode being electrically insulated from the second electrode, and first and second supports adapted to support said first and second electrodes, respectively, and arranged to allow said electrodes to be moved independently of one another relative to said chamber from outside said chamber.

This arrangement in which separate supports are provided for each electrode allows the electrodes to be moved individually from outside the vacuum chamber, enabling parameters relating to the ion beam to be controlled with greater flexibility.

BRIEF DESCRIPTION OF THE DRAWINGS

Examples of embodiments of the present invention will now be described with reference to the drawings in which.

DESCRIPTION OF PREFERRED EMBODIMENTS

Figure 1:
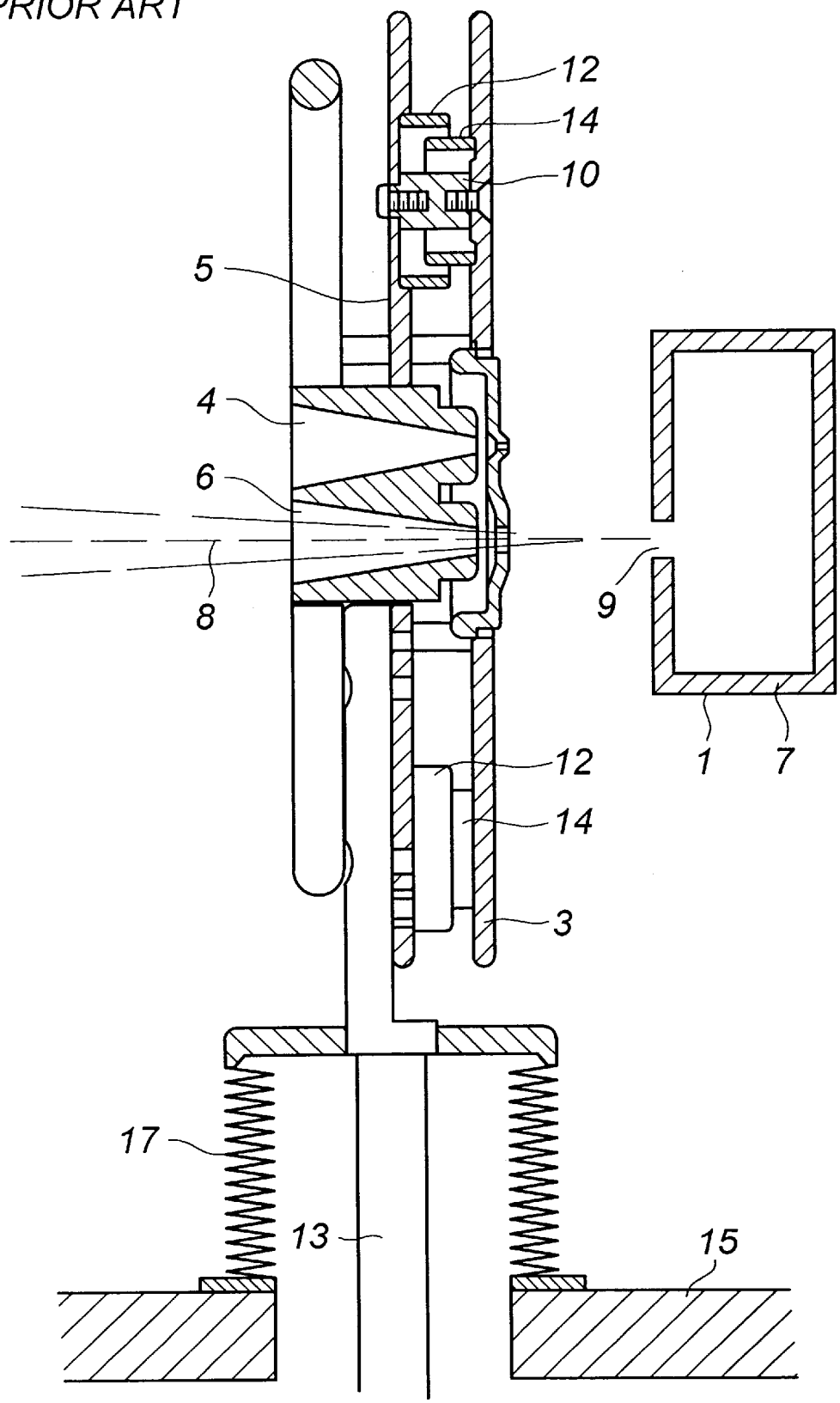
FIG. 1 shows a plan view of an example of a prior art apparatus.
Figure 2:
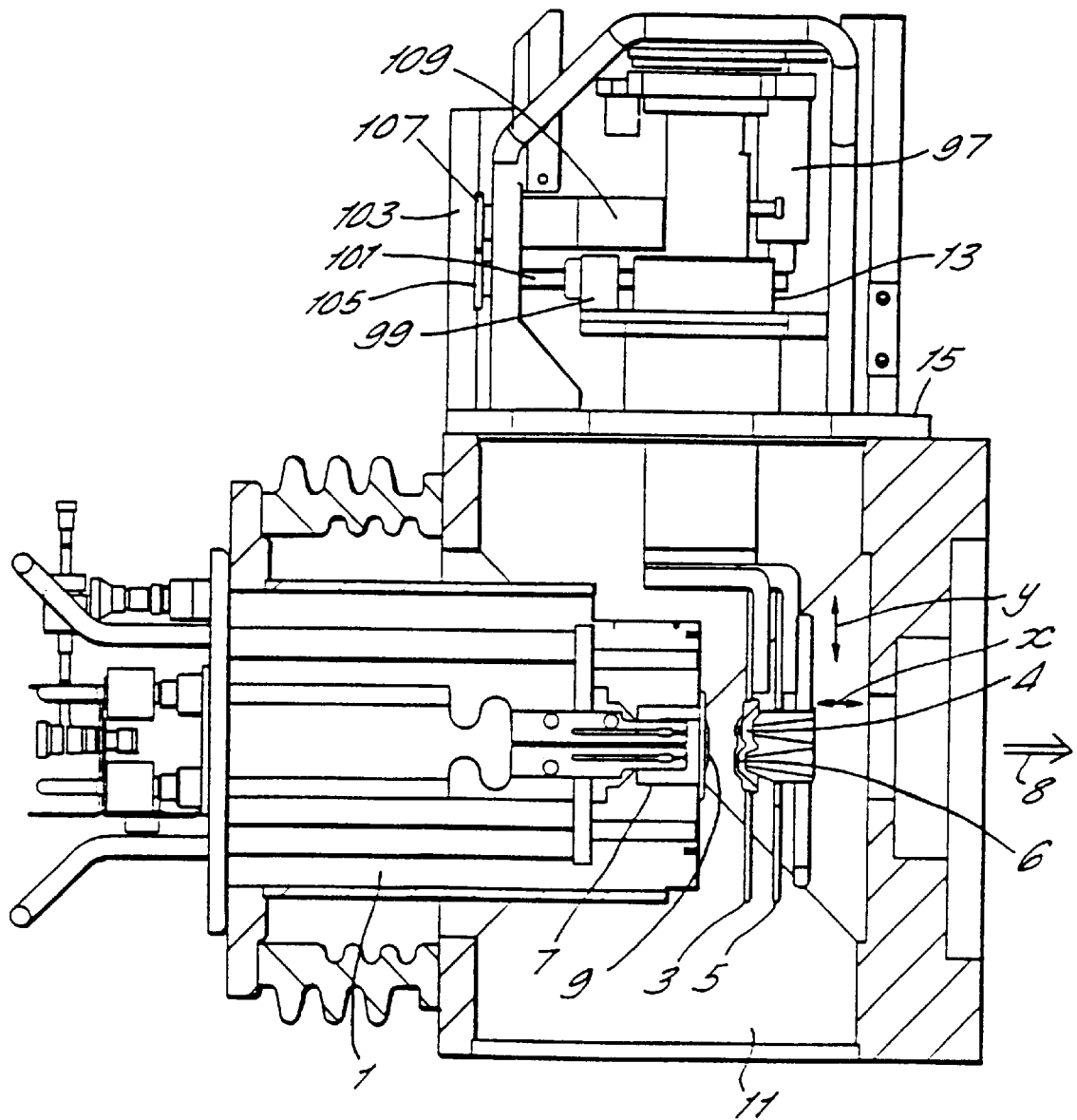
FIG. 2 shows a part sectional plan view of an ion beam apparatus according to one embodiment of the present invention.

Referring to FIG. 2, one embodiment of the ion beam apparatus comprises an ion source 1 and a pair of plate electrodes 3, 5 spaced from the ion source and from each other in the direction of the beam line 8. The ion source, which may be a Freeman type source, comprises a chamber 7 in which a plasma can be generated and has an exit slit 9 formed in the front face thereof. Two sets of opposed apertures 4, 6 are formed in the extraction electrodes 3, 5, each set defining the extraction optics for a particular range of extraction conditions. The extraction electrodes 3, 5 are housed within an evacuatable chamber 11. The electrodes 3, 5 are supported and their position is controlled by an actuator assembly 13 which is mounted on a detachable wall section 15 of the evacuatable chamber 11.

Figure 3:
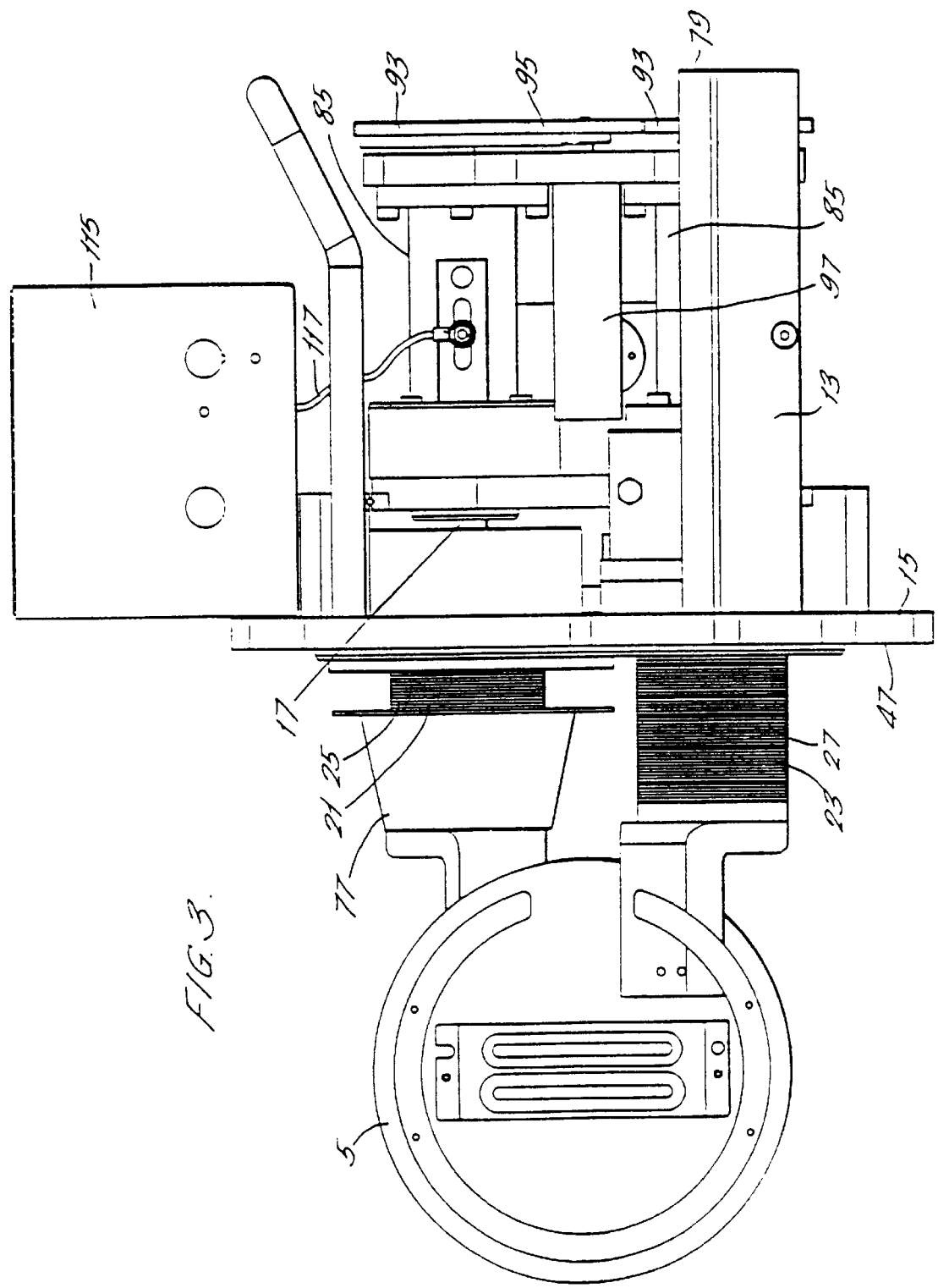
FIG. 3 shows a front view of the extraction electrode assembly and actuator of the embodiment shown in FIG. 2.
Figure 4:
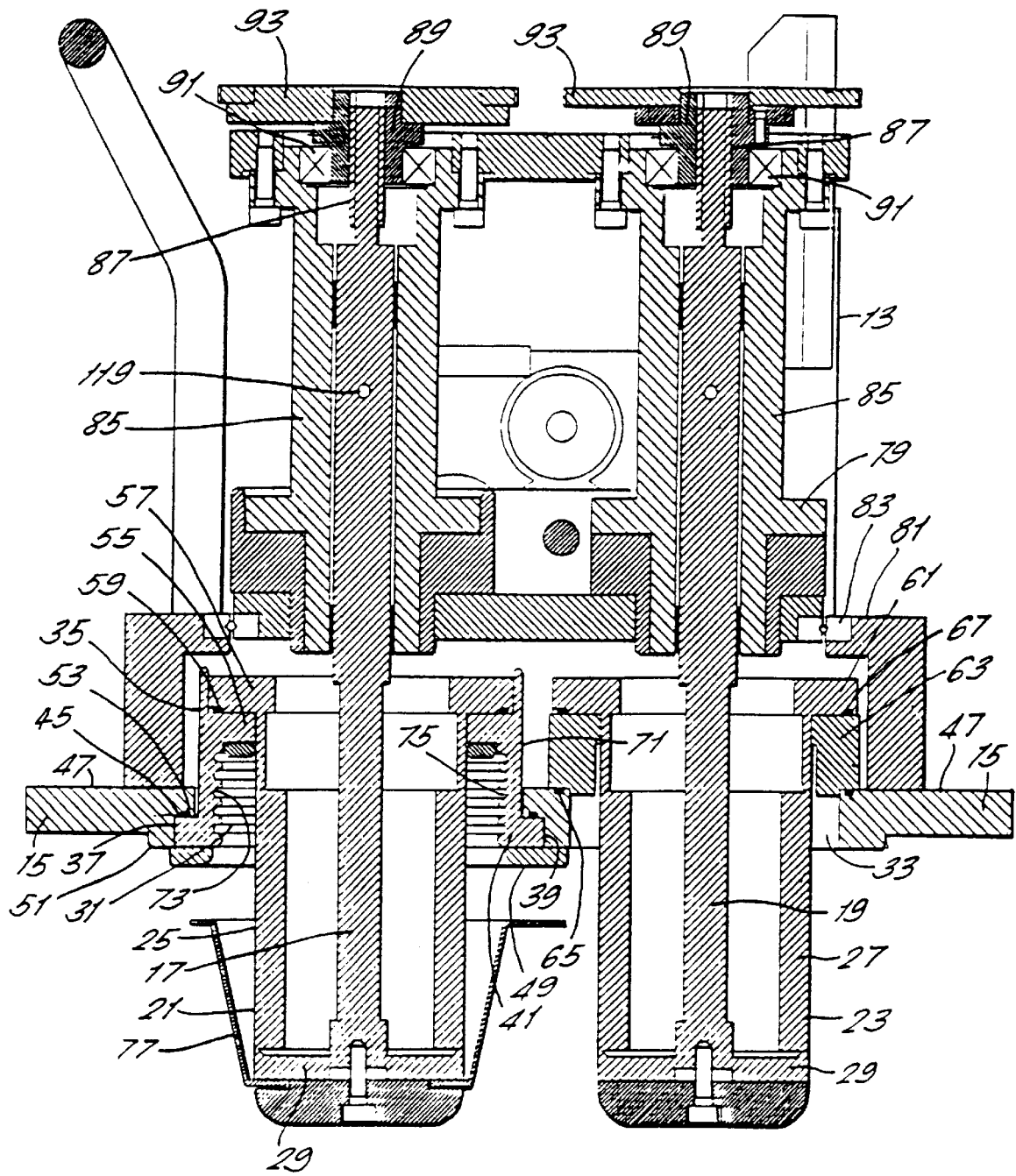
FIG. 4 shows a sectional view of the actuator assembly shown in FIGS. 2 and 3.

Referring to FIGS. 3 and 4, separate actuator arms 17, 19 support the extraction electrodes 3, 5 (not shown in FIG. 4) and are each coupled across the vacuum chamber wall by a respective flexible coupling member, for example bellows 21, 23 which allow each arm to move both transversely and parallel to the chamber wall section 15. The bellows 21, 23 each have a convoluted cylindrical wall 25, 27, one end of which is connected to a respective actuator arm 17, 19 via an end part 29.

Two apertures 31, 33 are formed in the chamber wall section 15. One of the apertures 31 has a stepped configuration 37, with the larger diameter bore 39 being formed in the inward side of the chamber wall section 15. An electrically insulating member 35, having a generally cylindrical form and comprising an outwardly extending flange 41 at one end thereof, is located in the aperture 31. The outwardly extending flange 41 is seated against the shoulder 45 defined by the stepped aperture 31, and the insulating member 35 extends through the aperture 31 beyond the external face 47 of the chamber wall section 15. A ring clamp 49 is positioned against the inner face 51 of the wall section 15 and over at least part of the outwardly extending flange 41 and is screwed into the wall section 15 to hold the insulating member 35 in place. An 'O' ring 53 is positioned between the opposed surfaces of the flange 41 and inner rim of the stepped aperture 31, and is held in compression by the clamping ring 49 to form a vacuum seal between the wall section 15 and the insulating member 35.

An inwardly extending flange 55 is formed near the other end of the insulating member 35 and defines an aperture through which the bellows 21 is received. An outwardly extending flange 57 is formed at the end of the bellows 21 furthest from the part 29 on which the electrodes are mounted, and this flange 57 is seated within the electrically insulating member 35 and abuts the inwardly extending flange 55. An 'O' ring 59 is positioned between these two flanges 55, 57 to form a vacuum seal between the bellows 21 and the insulating member 35.

The other bellows 23 is received in the other aperture 33 of the chamber wall section 15, and has an outwardly extending flange 61 formed at the opposite end from the end part 29 which is connected to the actuator arm 19. The bellows 23 is mounted on the outside of the chamber wall section 15 via a spacer ring 63 which is sandwiched between the flange 61 and the rim 65 of the aperture 33, so that both bellows 21, 23 protrude by equal amounts beyond the outer face of the wall section 15. 'O' rings 67, 69 are placed between the flange 61 of the bellows 23 and the spacer ring 63 and between the spacer ring 63 and the outer rim 65 of the wall section 15 so as to form a vacuum seal between these joints.

In this embodiment, both bellows 21, 23 comprise an electrically conductive material, e.g. stainless steel, and are each electrically connected to a respective extraction electrode 35. This embodiment is arranged so that the extraction electrode 5 which is furthest away from the ion source 1 is permanently maintained at ground potential with the conductive path between the electrode 5 and ground being formed by the bellows 23, the spacer rings 63 and the chamber wall section 15, all of which comprise electrically conductive materials. High voltages are applied only to the suppression electrode 3, nearest the ion source 1, so that only one electrically insulating member 35 is required.

In this arrangement, part of the external surface 71 of the insulating member 35 forms part of the external surface of the chamber wall. Therefore, in use, this surface is cooled naturally by the air which surrounds and flows next to the chamber wall, and heat transferred to the insulating member 35 from the ion source gases is conducted through the insulating member from the surface 73 within the chamber to the air outside the chamber. In this way, the surface of the insulating member within the chamber is cooled, with the result that the rate of condensation of deposits over the surface of the insulator is substantially reduced. The inventors have found that by taking this single step, the life of the insulating member can be increased by a factor of 10 or more as compared to the prior art arrangement.

An important advantage of arranging the electrically insulating member to be cooled is that the range of different materials from which the insulator can be made is substantially increased, as the materials are no longer limited to those which can withstand the high temperatures present in the vicinity in the ion source. In particular, it is now possible to make the insulating member from plastics, polymers and epoxies as well as ceramics, and these may include Delrin™, PTFE, PVC, alumina, boron nitride and Steatite. The advantages of using plastics, polymers or epoxies is that they are generally less expensive than ceramics and can be formed more easily into the desired shape.

This embodiment further includes the following additional features which also contribute to extending the life of the insulating member 35, by reducing the rate of condensation of conductive deposits over its internal surface. Referring again to FIG. 4, the insulating member 35 is so arranged to extend outwardly beyond the outer face 47 of the chamber wall section 15, which ensures that the internal surfaces of the insulating member within the chamber are well removed from the ion source region. Furthermore, the internal surface 73 of the insulating member 35 is formed with corrugations or undulations so that the distance between the suppression electrode 3 and the chamber wall 15 over the surface of the insulating member is increased. Moreover, the lower portions 75 of the corrugations face away from the exit aperture 9 of the ion source so that these regions are better screened from the ion source gases. In addition, in this embodiment a shield 77 is arranged so as to at least partially cover the annular aperture 32 formed between the wall 25 of the bellows 21 and the insulating member 35, thereby further screening the inner surface insulating member 35 from the ion source gases. In this embodiment, the shield 77 has a frusto-conical shape although many other shapes are possible, and fits over the bellows with the smaller diameter end being mounted at the end of the bellows nearest the suppression electrode 3.

The bellows 21 which is arranged between the suppression electrode 3 and the insulating member 35 serves to thermally isolate the electrode 3 from the electrically insulating member 35, again to minimise the heat transferred to the insulating member. The convoluted wall 25 of the bellows is particularly effective in minimising the heat transferred from the electrode 3 to the insulating member, since, as with the insulating member, the internal surface 26 of the bellows 21 forms an external surface portion of the chamber wall and is therefore in direct contact with air outside the vacuum chamber, which serves to cool the bellows. Furthermore, the convoluted part of the bellows is so configured as to effectively extend the surface area of the bellows in contact with the air outside the chamber and furthermore, this part of the bellows wall is relatively thin and therefore presents a relatively high impedance to thermal conduction from one end of the bellows to the other. Moreover, the convoluted part of the walls of the bellows may comprise stainless steel which is a relatively poor conductor of heat.

Referring again to FIG. 2, the actuator assembly 13 is designed so as to be able to move the extraction electrodes 3, 5 in directions both parallel and transverse to the chamber side wall section 15, as indicated by arrows 'x' and 'y', respectively, so that the distance between the extraction electrodes and the ion source and the alignment between the extraction apertures 4, 6 and the ion source exit slit 9 can be varied.

Returning to FIG. 4, the actuator assembly 13 comprises a support structure 79 which is mounted on support blocks 81 secured to the chamber wall section 15. The support structure 79 is slidably mounted on the support blocks 81 via roller slides 83 so that the support structure is free to move in a direction normal to the page, i.e., so that the extraction electrodes 3, 5 can be moved towards or away from the ion source. The support structure 79 comprises a pair of transversely spaced bearing blocks 85 which receive and support a respective actuator arm 17, 19, and which allow each arm to move transversely of the chamber wall section 15 to permit transverse movement of the extraction electrodes 3, 5 across the ion source exit slit 9.

Figure 5:
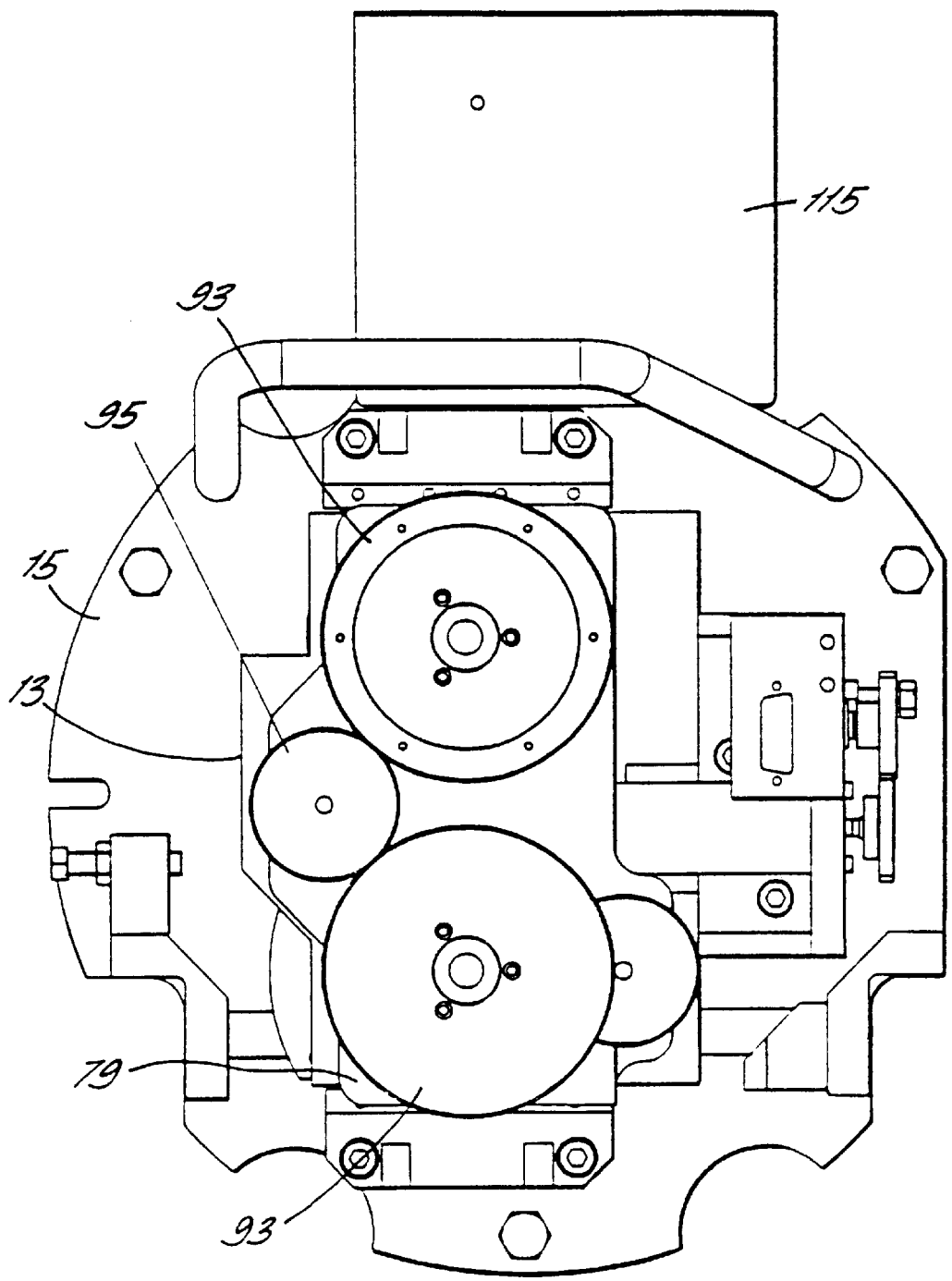
FIG. 5 shows an end view of the actuator assembly shown in FIGS. 2 to 4.

A threaded shaft 87 is formed at the end of each actuator arm 17, 19. A complementary nut 89 is screwed onto each threaded shaft and engages with a thrust bearing 91 which is seated in a recess formed in the end of each bearing block 85 so that each nut 89 is free to rotate but its axial position is fixed. A gear wheel 93 is mounted on the end of each nut ind both engage with a further gear wheel 95, shown in FIGS. 3 and 5, which is driven by an electric motor 97 shown in FIGS. 2 and 3. Thus, by rotating the nuts 89, the actuator arms 17 and 19 are driven axially along a respective bearing block 85 causing the extraction electrodes 3, 5 to move transversely with respect to the ion source.

A further driving mechanism is provided to move the extraction electrodes 3, 5 toward or away from the ion source independently of any transverse movement. Referring to FIG. 2, a ball nut 99 is mounted on the actuator support structure 79 and receives a threaded ball shaft 101 which is rotatably mounted in a bracket 103 fixed to the vacuum chamber side wall section 15. A gear wheel 105 is mounted co-axially on the threaded shaft 101 and engages a further gear wheel 107 which is driven by an electric motor 109. Rotation of the threaded shaft 101, which is driven by the electric motor 109 through the gear wheels 105, 107 propels the ball nut axially along the shaft 101, thereby causing the actuator support structure 79 and extraction electrodes 3, 5 to move in the direction 'x' parallel to the side wall section 15 of the vacuum chamber.

In this embodiment, the separation between the extraction electrodes 3, 5 is fixed by the fixed relationship between the actuator arm bearing blocks 85 in the actuator support structure 79. However, in another embodiment the actuator may be arranged so that the actuator arms can be moved in a direction transverse to their longitudinal axis independently of one another so that the separation between the extraction electrodes can also be varied, in addition to their distance from the ion source. In one embodiment, the inter-electrode separation may be allowed to vary by mounting the bearing block 85 associated with one of the actuator arms 17, 19 on a further roller slide or other suitable bearing, which enables the bearing block to move in the direction 'x', shown in FIG. 2, parallel to the vacuum chamber side wall section 15, i.e., perpendicular to the sheet containing FIG. 4.

In the embodiment shown in FIGS. 2 to 5, the driving mechanism responsible for driving the actuator arms transverse to the ion source, i.e., in the direction 'y' shown in FIG. 2, is arranged to drive both actuator arms together through the bearing blocks as though the actuator arms 17, 19 were rigidly joined together. However, in another embodiment, each actuator arm may be independently driven in a direction transverse to the ion source so that the position of the extraction electrodes relative to each other may be changed in a transverse direction. This arrangement would allow the alignment between the apertures formed in the extraction electrodes to be varied so enabling the exit angle of the ion beam to be controlled. This would allow, for example, the user to compensate for any offset in the beam line angle caused by the ion source magnet.

As mentioned above, the embodiment shown in FIGS. 2 to 5 is designed to allow a high voltage to be applied to one of the extraction electrodes only. Advantageously, the actuator arm 17 provides an electrically conductive path to the suppression electrode 3, which removes the need for a separate high voltage lead within the vacuum chamber. Referring to FIG. 3, a high voltage source 115 is mounted on the chamber wall section 15 and a suitable electrical lead 117 from the high voltage source 115 is connected to the actuator arm 17 through an aperture formed in the bearing block 85. The point of connection is indicated by the hole 119 formed in the actuator arm 17 shown in FIG. 4, which receives a screw for clamping the lead 117 to the actuator arm 17.

Figure 6:
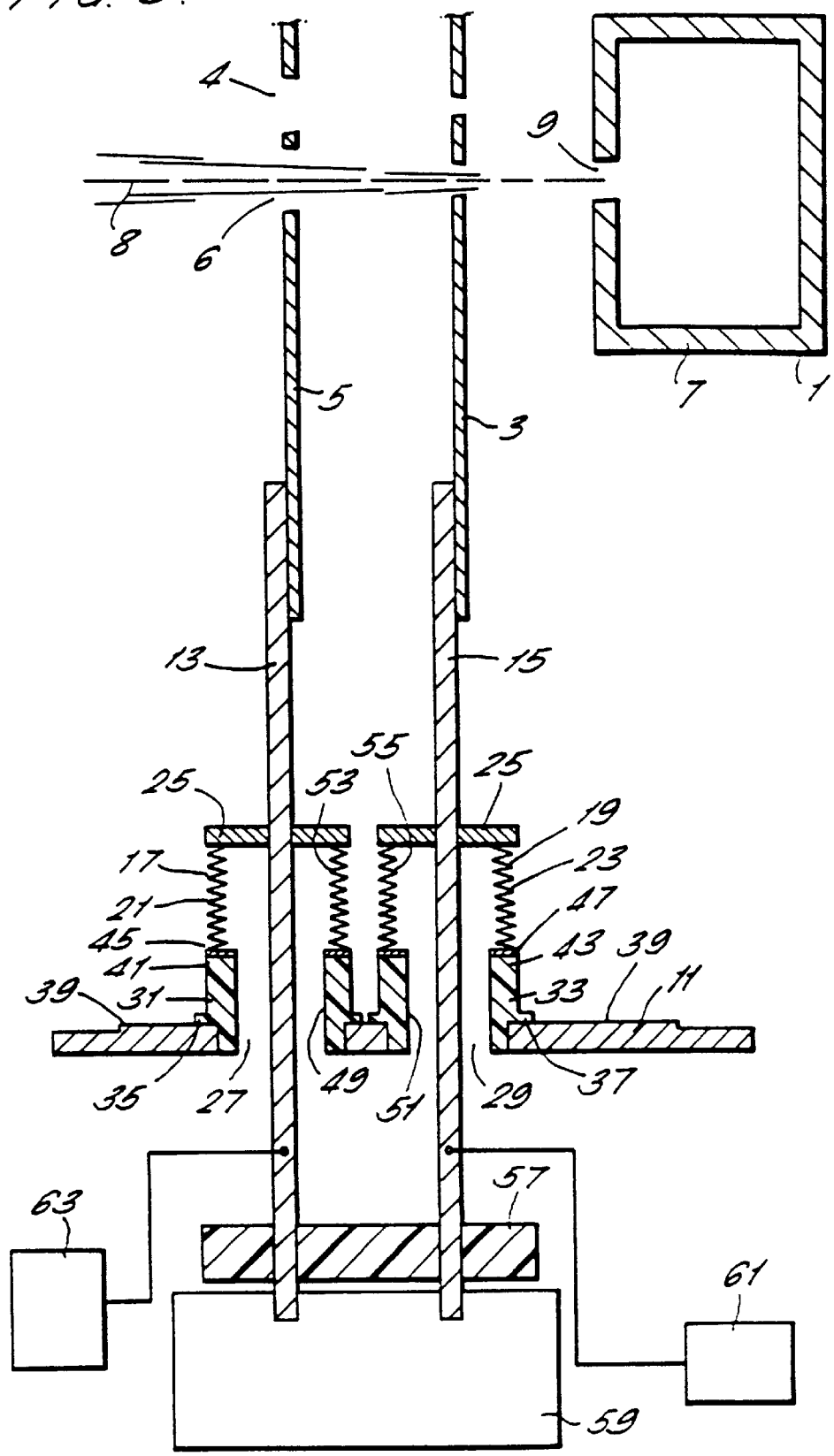
FIG. 6 shows a schematic plan view of another embodiment of the present invention.

In another embodiment, the ion beam apparatus may be adapted so that both extraction electrodes can be individually voltage biased and an example of such an embodiment is shown schematically in FIG. 6.

Referring to FIG. 6, another embodiment of the ion beam apparatus comprises an ion source 1 and a pair of plate electrodes 3 and 5 spaced from the ion source and from each other in the direction of the beam line 8. The ion source comprises a chamber 7 in which a plasma is generated and has an exit slit 9 formed in the front face thereof. Two sets of opposed apertures 4 and 6 are also formed in the electrodes 3 and 5, one of which is positioned generally opposite the exit aperture 9 of the ion source. The electrodes 3 and 5 are housed within an evacuatable chamber, only a section 11 of the wall of the chamber being shown in FIG. 6. The section 11 of the chamber wall is detachably mounted to the main chamber wall. Separate actuator arms 13, 15 support the electrodes 3, 5 and are each coupled across the chamber wall by a respective flexible coupling member, for example bellows 17, 19 which allow each arm to move both transversely and parallel to the chamber wall. The bellows 17, 19 each have a convoluted cylindrical wall 21, 23 one end of which is connected to the actuator arm 13, 15 via an end part 25.

Two apertures 27, 29 are formed in the chamber wall section 11. An insulating member 31, 33 having a generally cylindrical form is seated over each aperture 27, 29, and one end of the electrically insulating member 35, 37 abuts against the inner surface 39 of the chamber wall section 11 to form a vacuum seal therewith. The other end 41, 43 of the electrically insulating member is sealed to the end 45, 47 of the bellows 17, 19 furthest from the electrode 3, 5.

In this arrangement, the internal surfaces 49, 51 of the cylindrical insulating members 31, 33 form part of the external surface of the chamber wall. Therefore, in use, this surface is cooled naturally by the air which flows next to the chamber wall, and heat is conducted through the insulating member from the surface within the chamber to the air external of the chamber. In this way and as for the embodiment shown in FIGS. 2 to 5, the surface of the insulating member within the chamber is cooled, with the result that the rate of condensation of deposits over the surface of the insulator is substantially reduced.

The bellows 17, 19 thermally isolate the electrodes from the electrically insulating members 27, 29, again to minimise the heat transferred to the insulating members. The convoluted wall 21, 23 of the bellows is particularly effective in minimising the heat transferred from the electrodes 3, 5 to the insulating members since, as with the insulating members, the internal surfaces 53, 55 of the bellows form an external surface portion of the chamber wall and are therefore in direct contact with air outside the vacuum chamber, which serves to cool the bellows. Furthermore, the convoluted part of the bellows is so configured as to effectively extend the surface area of the bellows in contact with the air outside the chamber and furthermore, this part of the wall of the bellows is relatively thin and therefore presents a relatively high impedance to thermal conduction from one end of the bellows to the other. Moreover, the convoluted part of the walls of the bellows may comprise stainless steel, which is a relatively poor conductor of heat.

In this particular embodiment, an external insulating member 57 disposed outside the vacuum chamber, mechanically couples the actuator arms 13, 15 together, to maintain the electrodes 3, 5 within the vacuum chamber in a predetermined spatial relationship. An actuator 59, also disposed external of the vacuum chamber is coupled to the arms 13, 15 for controlling the position of the electrodes 3, 5 within the chamber.

In this embodiment, the external insulating member 57 connecting the actuator arms together has a similar function to the insulating spacers 10 in the prior art arrangement, in maintaining the electrodes within the chamber in a predetermined spaced relationship. However, the arrangement shown in FIG. 6 differs significantly from the prior art arrangement in that the external insulating member 57 is placed external of the vacuum chamber, and therefore the surface of the insulator is not exposed to deposition by ions from the ion source.

The provision of an internal insulating member between each of the electrodes and the vacuum chamber wall allows each electrode to be voltage biased relative to ground. Advantageously, each of the actuator arms may comprise an electrically conductive material so that the actuator arms not only support the electrodes but also provide a conductive path from the voltage supplies to the electrodes. This removes the need for separate leads to each electrode and associated seals and electrical insulation through the chamber wall. In the embodiment shown in FIG. 6, voltage supplies 61, 63 are connected to the actuator arms 13, 15 respectively at positions external of the vacuum chamber.

In another embodiment, where one of the electrodes is always maintained at ground potential, it is possible to omit the internal insulating member associated with that electrode, as, for example, is the case in the embodiment shown in FIGS. 2 to 5. Thus, for example, if the forward electrode 5 furthest away from the ion source 1 is to be maintained always at ground potential, the insulating member 31 could be omitted so that the bellows 17 are mounted directly on the chamber wall section 11, with a conductive path between the electrode 5 and the grounded chamber wall being provided by the actuator arms and bellows.

Figure 7:
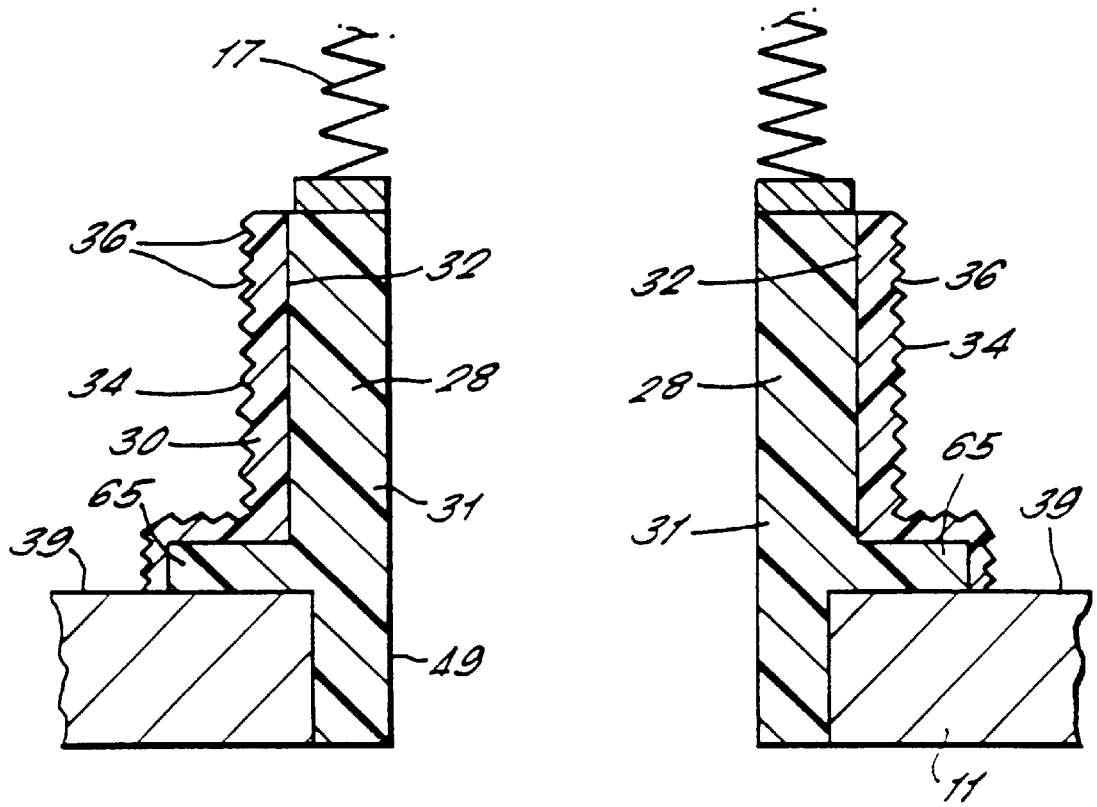
FIG. 7 shows one embodiment of the insulating member.

FIG. 7 shows an embodiment of an electrically insulating member in more detail. As for the embodiment shown in FIG. 6, the internal insulating member 31 has a generally cylindrical form and a flange 65 is formed towards one end of the insulating member which abuts the inner face 39 of the wall section 11, to form a vacuum seal therewith. The insulating member 31 comprises two separable parts 28, 30. One of the parts 28 provides the main supporting structure for the bellows and the other part 30 lines the surface 32 of the main part 28 within the vacuum chamber. The liner or cover 30 prevents deposition of ions from the ion source over the surface of the main part 28 of the insulating member. The outer surface 34 of the liner 30 is corrugated so as to extend effectively the path length over the surface 34 between the bellows and the chamber wall section 11. Furthermore, the lower faces 36 of the corrugations generally face away from the ion beam and are effectively in shadow so that the rate of deposition over these regions is substantially reduced to extend the lifetime of the liner. The main part 28 of the insulating member and the liner may comprise any suitable material, for example, plastics, polymers, epoxies or ceramics and may be made of the same material or different materials. However, as the liner is designed to be disposable, it may be preferred to make the liner from one of the cheaper materials such as epoxy.

The provision of a liner to line the surface of the insulating member allows electrical insulation of the insulating member to be restored as and when required without having to replace the whole unit and therefore reduces cost and servicing time. A further advantage is that the liner need not form part of the vacuum seal. The removable liner may comprise a single part or a plurality of parts which connect together. Advantageously, a multi-part liner may facilitate its removal and replacement.

Figure 8:
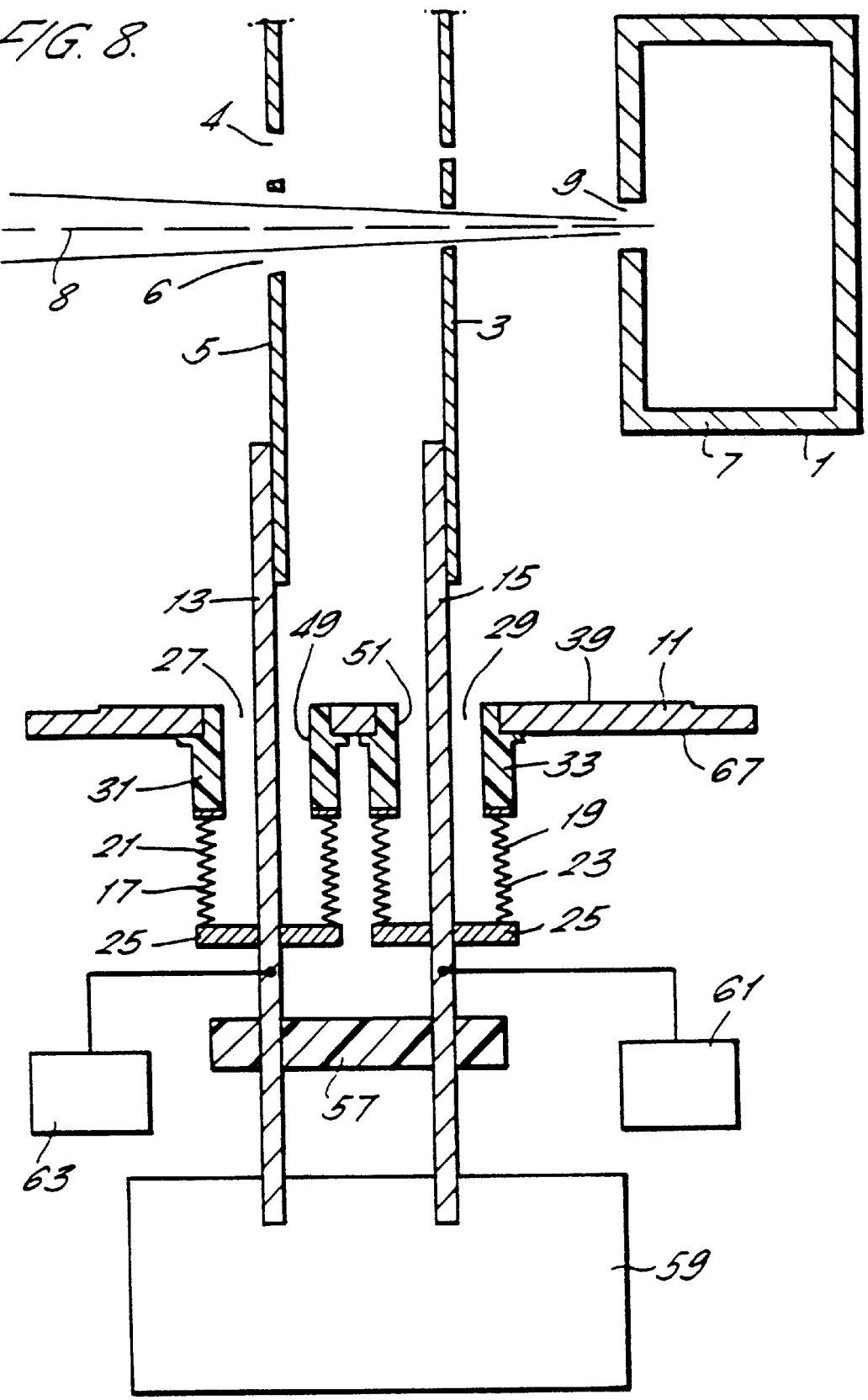
FIG. 8 shows a schematic plan view of another embodiment of the present invention.

FIG. 8 shows another embodiment of an ion beam apparatus comprising an ion source 1 and two electrodes 3, 5 for forming the ion beam which are both spaced from the ion source 1 and from each other. This embodiment is similar to that shown in FIG. 6, and like parts are designated by the same reference numerals.

The main difference between the embodiment shown in FIG. 8 and that shown in FIG. 6 is that the cylindrical insulating members 31, 33 and the bellows 17, 19 are arranged so as to protrude outwardly from the chamber wall section 11. One end of each cylindrical insulating member is mounted adjacent the external face 67 of the wall section 11 and the other end is connected to one end of a respective bellows. The other end of each bellows is connected to a respective actuator arm 13, 15.

The advantage of this arrangement is that since the internal insulating members 31, 33 and bellows 17, 19 extend beyond the outer surface of the chamber wall section 11, natural cooling by air flowing outside the vacuum chamber is enhanced. Furthermore, the surfaces of both the insulating members and the bellows within the vacuum chamber are more remote and better screened from the ion source and gas flow through the electrodes. This assists in extending the lifetime of the insulating members and increases the thermal insulation of the bellows.

Just as for the embodiment shown in FIG. 7 a separate removable liner (not shown) may be provided for each internal insulating member for protecting the inner face of each insulating member from deposition by ions from the ion source.

Figure 9:
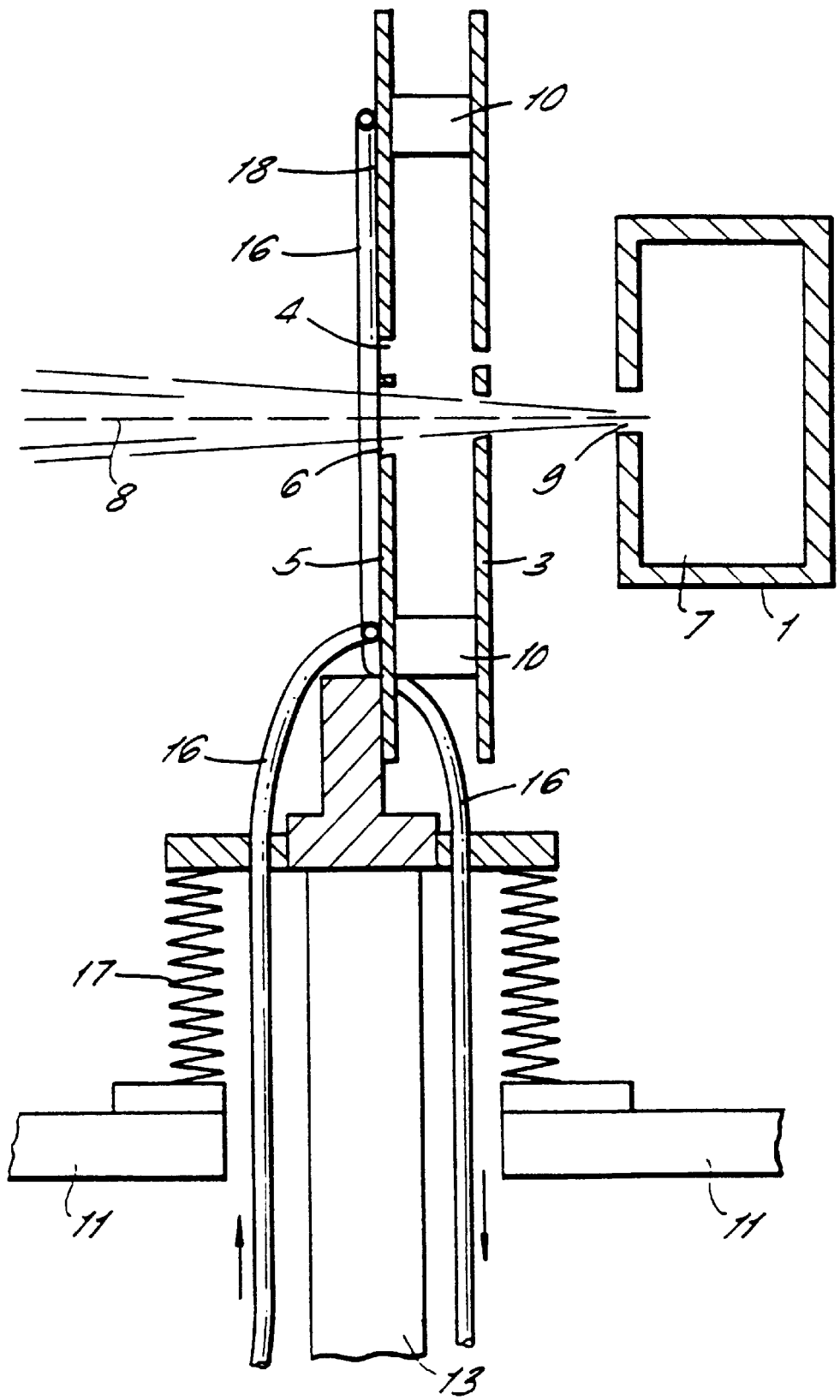
FIG. 9 shows a schematic plan view of an arrangement in which the insulating member is actively cooled.

FIG. 9 shows another embodiment of the present invention in which the insulating members are actively cooled. The apparatus comprises an ion source 1 and two electrodes 3, 5 spaced from the ion source and from each other. The electrode 5 which is furthest away from the ion source 1, that is, the forward electrode is mounted on an actuator arm 13 and the other, back electrode 3 is supported from the furthest electrode 5 by a plurality of insulating members 10. A high voltage lead 20 extending from a terminal in the chamber wall 11 is connected to the electrode 3 nearest the ion source to enable a voltage to be applied to the electrode. A fluid conduit 16 is disposed adjacent the furthest electrode 5 and is mounted on the front face 18 of the forward electrode 5, so that parts of the conduit 16 lie generally opposite each of the insulating members 10. The actuator arm 13 is coupled to the wall 11 of the vacuum chamber via bellows 17 and the conduit 16 passes into and out of the vacuum chamber through the end part 21 of the bellows 17, which forms part of the chamber wall and whose position relative to the electrodes is fixed so that the part of the conduit 16 within the chamber is not subjected to stress as the position of the electrodes is changed. The conduit preferably comprises a material having good thermal conductivity e.g., a metal such as copper. The conduit may be joined to the electrode by any suitable means, for example by soldering, braising or welding. The conduit is preferably placed as close to the internal insulating members 10 as possible so as to maximise the rate of cooling thereof. The fluid conduit 16 may have any suitable external cross-sectional geometry, and in one embodiment, the side of the conduit which mates with the electrode is flat so as to make good thermal contact with the electrode. The internal cross-sectional geometry of the conduit may also be of any suitable shape but, again, preferably the inner surface of the conduit neighbouring the electrode presents as larger a cross-sectional area as possible between the electrode and coolant.

To cool the insulator, any suitable coolant, such as water, is pumped through the conduit whereby heat is extracted from the insulator through the electrode, and the heated coolant passes out of the vacuum chamber and is subsequently cooled before being re-circulated.

Figure 10:
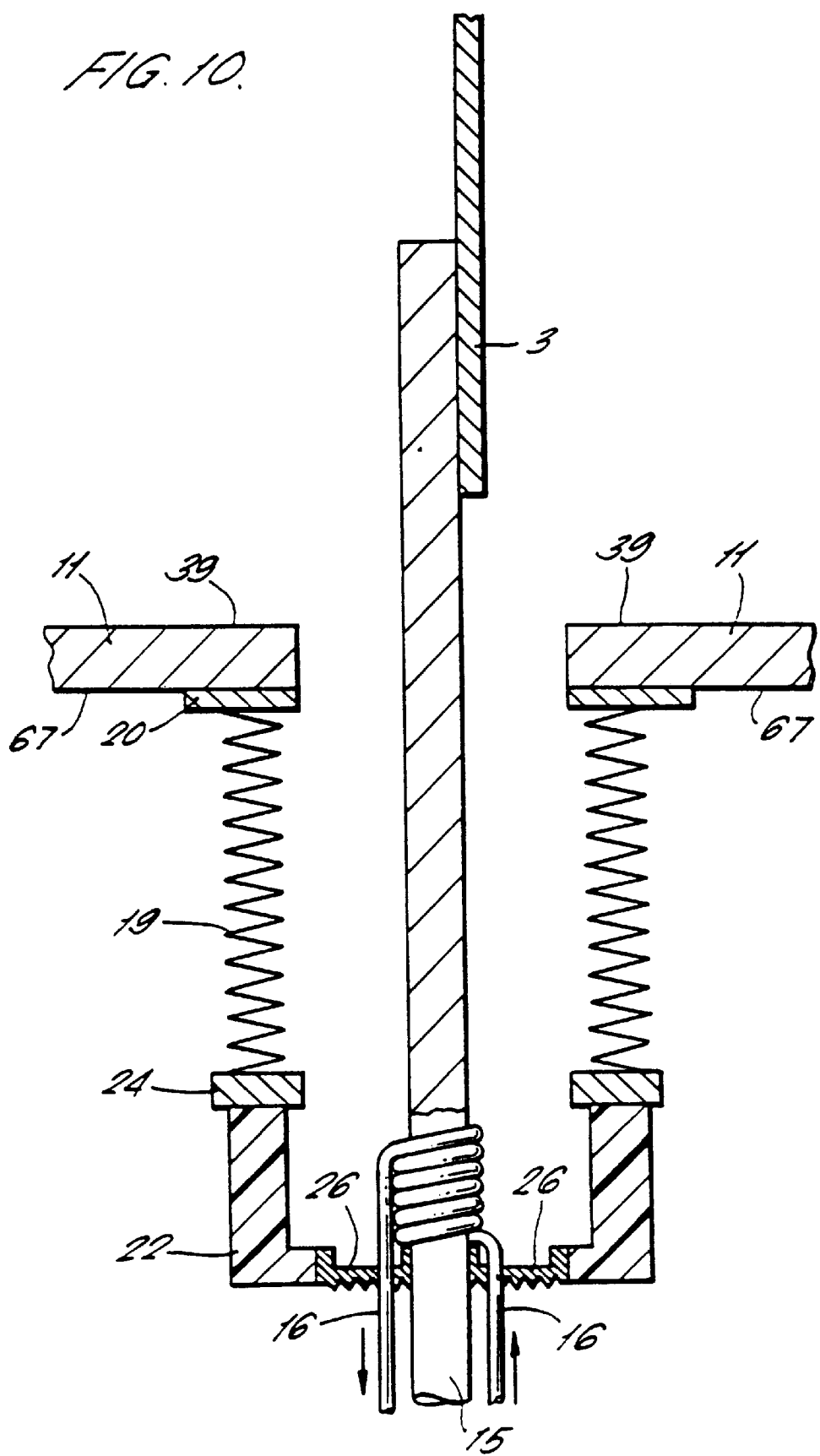
FIG. 10 shows a schematic plan view of another embodiment in which the insulating member is actively cooled.

FIG. 10 shows an arrangement of an alternative embodiment of the present invention in which the electrically insulating member benefits from cooling at the vacuum/air interface. Only one electrode is shown, but a similar arrangement may be used for other electrodes. In this embodiment, an electrode 3 is supported by an actuator arm 15, which is coupled to the vacuum chamber wall via a bellows 19. One end 20 of the bellows 19 is connected directly to the chamber wall 11 such that the bellows protrudes outwardly of the chamber wall 11. An electrically insulating member 22 is interposed between the actuator arm 15 and the other end 24 of the bellows. The electrically insulating member forms part of both the internal and external surfaces of the vacuum chamber wall. This embodiment differs from those shown in FIGS. 6 and 7 in that in the embodiment shown in FIG. 10, the insulating member is disposed between the actuator arm 15 and one end of the bellows, as opposed to being positioned between the vacuum chamber wall and the bellows, so that in this embodiment, the bellows does not provide thermal insulation between the insulating member and the electrode.

In order to prevent heat being conducted from the electrode to the insulating member, the part of the actuator arm 15 in the region of the insulating member may be actively cooled. In this embodiment, a conduit 16 is wrapped around the actuator arm so that heat conducted from the electrode along the actuator arm can be extracted by means of a coolant.

The potential advantage of this embodiment over the embodiment shown in FIG. 7 is that the insulating member 22 is more remote and better screened from gases extracted from the ion source so that potentially, the inner surface of the insulating member becomes contaminated with deposits less quickly.

Instead of or in addition to actively cooling the actuator arm, an intervening member for thermally insulating the electrically insulating member from the actuator arm may be disposed between the actuator arm and the insulating member. The thermally insulating member may have a small cross-sectional area and thereby present a considerable impedance to conduction of heat between the actuator arm 15 and the insulating member 22, and alternatively or in addition, may have a considerable surface area exposed to the air external of the vacuum chamber so that heat transferred to the thermally insulating member can be efficiently transferred to the surrounding air, rather than to the electrically insulating member. An example of such an intervening member 26 is shown in FIG. 10.

In other embodiments of the present invention in which the electrically insulating member is adjacent the vacuum chamber wall, the insulating member need not necessarily be exposed directly to the air surrounding the vacuum chamber. Instead, the electrically insulating member may be disposed wholly within the vacuum chamber with a part of the insulating member being adjacent the inner surface of the wall of the vacuum chamber. A recess may be formed on the inside of the vacuum chamber wall into which the electrically insulating member is fitted. Preferably, the insulating member is in direct contact with the vacuum chamber wall. However, it is to be noted that the insulating member need not be in direct contact with the chamber wall and there may be one or more intervening members between the electrically insulating member and the actual wall of the vacuum chamber. However, it is important that the insulating member is sufficiently close to the wall of the vacuum chamber to benefit significantly from cooling at or by the vacuum chamber wall. Therefore, it is important that any intervening members disposed between the vacuum chamber wall and the insulating member are arranged so as to disrupt the flow of heat from the insulating member to the chamber wall as little as possible. In practice, the vacuum chamber wall comprises a material having a high thermal conductivity, for example a metal or alloy, and heat transferred to the vacuum chamber wall from inside the vacuum chamber is conducted efficiently through the chamber wall and transferred to the surrounding air. An aspect of the present invention takes advantage of this efficient conduction of heat through the chamber wall to extract heat from the electrically insulating member which electrically insulates one electrode from the other.

In another embodiment, the vacuum chamber wall and in particular the part of the vacuum chamber wall in the vicinity of the insulating member may be actively cooled to increase the rate at which heat is withdrawn from the electrically insulating member through the vacuum chamber wall. Advantageously, such cooling may be effected and controlled from outside the vacuum chamber so that no internal modifications are required and there is no need for coolant to enter the vacuum chamber which may otherwise present a potential hazard with the risk of coolant leaking into vacuum.

Although in the embodiments described above, the position of the electrodes relative to the chamber can be changed from outside the vacuum chamber, this need not necessarily be the case. Instead, one or more of the electrodes can be mounted so as to have a fixed spatial relationship with respect to the chamber. In another embodiment, the ion source could be arranged so that its position could be changed relative to the chamber.

In any of the embodiments described above, the actuator arms, the bellows and the detachable wall section may comprise any suitable material and may be either electrically conductive or non-conductive. Furthermore, the electrodes may be formed either separately or integrally with the actuator arms.

In another embodiment, electrical insulation between the electrodes may be provided by a single unitary insulating member and this insulating member may be further adapted to provide a flexible coupling to allow at least one actuator arm to support at least one electrode from outside the vacuum chamber.

In order to increase further the lifetime of the electrically insulating member, additional screening may be provided to shield the insulating member from the gases extracted from the ion source.

Although in the embodiments described above, the electrodes are displaced from each other generally in the direction of the ion beam, this need not necessarily be the case. In other embodiments, the electrodes may both lie in a common plane transverse to the beam line.

In other embodiments, there may be more than two electrodes, these other electrodes either being fixed or individually supported on an actuator so that the position of the electrodes can be individually controlled.

The electrically insulating member may comprise any suitable material, for example, Delrin™, PTFE, Epoxy, Alumina, Boron Nitride and Steatite as well as other plastics, polymers and ceramics and other materials. Preferably, the material used has as high a thermal conductivity as possible.

Where the electrically insulating member forms part of the external wall of the vacuum chamber, any suitable means of vacuum sealing the insulator to other parts of the chamber wall may be used, such as 'O' rings.

The electrodes for forming the ion beam need not necessarily be those which are proximate the ion source. For example, in an ion implanter, further electrodes for controlling the ion beam are disposed between the mass analysing magnet and the target to be implanted. Thus, in another embodiment, it is these further electrodes to which the present invention applies.

Any one or more features described above in relation to a particular embodiment may be combined with one or more features of another embodiment.

Modifications to the embodiments described above will be apparent to those skilled in the art.

We claim:

1. An ion beam apparatus comprising a source of ions, an evacuatable chamber, first and second electrodes disposed within said chamber, and adjacent said ion source for forming an ion beam from ions from said source, the first electrode being electrically insulated from the second electrode, and first and second supports for supporting said first and second electrodes, respectively, and arranged to allow said electrodes to be moved independently of one another relative to said chamber from outside said chamber.

2. An apparatus as claimed in claim 1, wherein at least one of said first and second supports is arranged to allow a respective electrode to be moved relative to the other electrode in a direction transverse to the beam line.

3. An ion beam apparatus comprising a source of ions, an evacuatable chamber, first and second electrodes disposed within said chamber and adjacent said ion source for forming an ion beam from ions from said source, the first electrode being electrically insulated from the second electrode and including at least one insulating member, at least part of which is within said chamber, to provide said insulation, and part of which is adjacent the wall of said chamber, wherein said electrode is mechanically coupled to a part of the wall of said chamber, said part of the wall being arranged to separate, at least partially, said electrode from said insulating member and adapted to permit said electrode to move in at least one direction relative to said ion source.

4. An apparatus as claimed in claim 3, wherein said part of the wall is formed with corrugations to permit the movement of said electrode.

5. An apparatus as claimed in claim 3, wherein said part of the wall comprises a flexible coupling member.

6. An ion beam apparatus comprising a source of ions, an evacuatable chamber, first and second electrodes disposed within said chamber for forming an ion beam from ions from said source, the first electrode being electrically insulated from the second electrode and including at least one insulating member, at least part of which is within said chamber, to provide said insulation, and a part of which is adjacent the wall of said chamber, first and second supports extending from said first and second electrodes, respectively, and each arranged to support a respective said electrode at a position substantially at or outside the wall of said chamber and wherein the wall of said chamber is adapted to allow both said first and second supports to move in at least one direction relative to said ion source, thereby allowing the position of said electrodes relative to said ion source to be changed.

7. An apparatus as claimed in claim 6, wherein the wall of said chamber is adapted to allow said supports to move in at least one direction relative to said chamber independently of one another, thereby allowing the position of the electrodes to be changed relative to one another.

8. An apparatus as claimed in claim 6, wherein the wall of said chamber includes a resilient portion coupled to at least one of said first and second supports to allow said movement.

9. An apparatus as claimed in claim 6, wherein said first and second supports are adapted to form an electrically conductive path to a respective said electrode from outside said chamber.

10. An ion beam apparatus comprising a source of ions, an evacuatable chamber, first and second electrodes disposed within said chamber for forming an ion beam from ions from said source, the first electrode being electrically insulated from the second electrode and including at least one insulating member, at least part of which is within said chamber, to provide said insulation, and a part of which is adjacent the wall of said chamber, said electrode being mechanically coupled to a part of the wall of said chamber, said part of the wall being arranged to separate, at least partially, said electrode from said insulating member and wherein the cross-sectional area of said part of the wall through which heat is conducted from said electrode to said insulating member is such as to oppose thermal conduction therethrough to thermally insulate said insulating member from said electrode.

11. An apparatus as claimed in claim 10, wherein said part is adapted to permit said electrode to move in at least one direction relative to said chamber.

12. An apparatus as claimed in claim 11, wherein said part is formed with corrugations to permit the movement of said electrode.

13. An apparatus as claimed in claim 10, wherein said part of the wall comprises a flexible coupling member.

14. An ion beam apparatus comprising a source of ions, an evacuatable chamber, first and second electrodes disposed within said chamber for forming an ion beam from ions from said source, the first electrode being electrically insulated from the second electrode and including at least one insulating member, at least part of which is within said chamber, to provide said insulation, and a part of which is adjacent the wall of said chamber, and further including a removable cover comprising an electrically insulating material and arranged to cover at least part of the surface of said insulating member within said chamber.

15. An apparatus as claimed in claim 14, wherein the outer surface of said removable cover includes surface formations to extend the path length over the surface of said cover between said first and second electrodes.

16. An apparatus as claimed in claim 15, wherein said surface formations include corrugations.

* * * * *